United States Patent [19]

Cusack et al.

[11] Patent Number: 4,959,706
[45] Date of Patent: Sep. 25, 1990

[54] INTEGRATED CIRCUIT HAVING AN IMPROVED BOND PAD

[75] Inventors: Michael D. Cusack, Monument; Michael P. Hagen; James E. Larkin, both of Colorado Springs, all of Colo.

[73] Assignee: United Technologies Corporation, Hartford, Conn.

[21] Appl. No.: 197,723

[22] Filed: May 23, 1988

[51] Int. Cl.⁵ .................. H01L 23/48; H01L 29/44; H01L 29/52
[52] U.S. Cl. ........................................ 357/68; 357/70
[58] Field of Search .................. 357/68, 70, 74, 69

[56] References Cited

U.S. PATENT DOCUMENTS 3,519,890  7/1970  Ashby .................................. 357/68

FOREIGN PATENT DOCUMENTS 0019136  1/1986  Japan .................................. 357/68
0004332  1/1987  Japan .................................. 357/68

Primary Examiner—Rolf Hille
Assistant Examiner—Hoanganh Le

[57] ABSTRACT

An improved bond pad on an integrated circuit has an elongated rectangular shape, on which the wire is bonded at a non-central location displaced toward an outer corner, so that there is room on the pad for a second bond site to be used for a rework bond. The pad corner closest to the path of a wire may be chamfered to reduce the distance of closest approach.

14 Claims, 2 Drawing Sheets

INTEGRATED CIRCUIT HAVING AN IMPROVED BOND PAD

TECHNICAL FIELD

The field of the invention is that of bonding leads to integrated circuits.

BACKGROUND ART

The conventional bonding technology used to connect the actual circuit chip to external leads is wire-bonding, either manual or automated. As is known, a fine wire is pressed against the material of the bond pad with pressure and/or heat used to effect a weld between the wire material and the metal on the bond pad. The wire bonding technology is quite well known and the actual bonding process is not part of this invention.

It is known in the art that a mis-bonded wire may be pulled off and the bond done again if there is sufficient room on the pad. In commercial applications, the restrictions on rebonding are generally technical—that the pad is not damaged or that there is sufficient undamaged area to make a new bond. In the particular field known as the aerospace market, standards generally conform to those set by the U.S. Government. The government provides detailed standards for acceptance of wire bonds and also for the amount of the rework that may be done to replace a defective bond. According to MIL-STD 883, for example, a bond that has been reworked is not acceptable if there is: "A bond on top of another bond, bond wire tail or residual segment of lead wire. An ultrasonic wedge bond alongside a previous bond where the observable width of the first bond is reduced less than 0.25 mils, is considered acceptable.", so that the location of the first bond can affect the success of a second bond.

Further, there are standards set by the government and also in conventional practice for the distance of closest approach between a wire extending from a pad and the adjacent bond pad, and for the distance of closest approach between two wires. This distance may be simply zero, or it may be any desired amount, depending on the customer's desires.

As integrated circuit technology has improved, the pitch, or spacing between corresponding points on adjacent bond pads, has constantly decreased in order to accommodate the use of smaller chips and greater numbers of input/output contacts. Consequently, it has become more and more difficult to make the bonds while still complying with the applicable standards. Conventional practice is not well adapted to reworking bonds and still staying within the permitted allowance. Rejected circuits mean an increase in the average cost of good circuits, of course.

According to conventional practice, the first bond on a pad is made in the nominal center of the pad, because that location permits the greatest chance that the first bond will be successful since the center has the greatest distance from each edge. When this is done, however, the second bond must be located close to the edge and, therefore, the second bond has a high chance of violating the tolerance standards.

DISCLOSURE OF THE INVENTION

The invention is directed at an improved bond pad and a relationship between the bond pad itself and the location of the bond site within the pad that permits a substantial improvement in the rework ability of bonds made according to the invention.

According to the invention, the first bond on a bond pad is made at a non-centered position i.e., the position where the bond is placed is not on the center of the pad but is displaced to one side. Accordingly, there is less room to make the first bond, but much more room than in the prior art for a second bond to be made if required.

BEST MODE OF CARRYING OUT THE INVENTION

Figure 2:
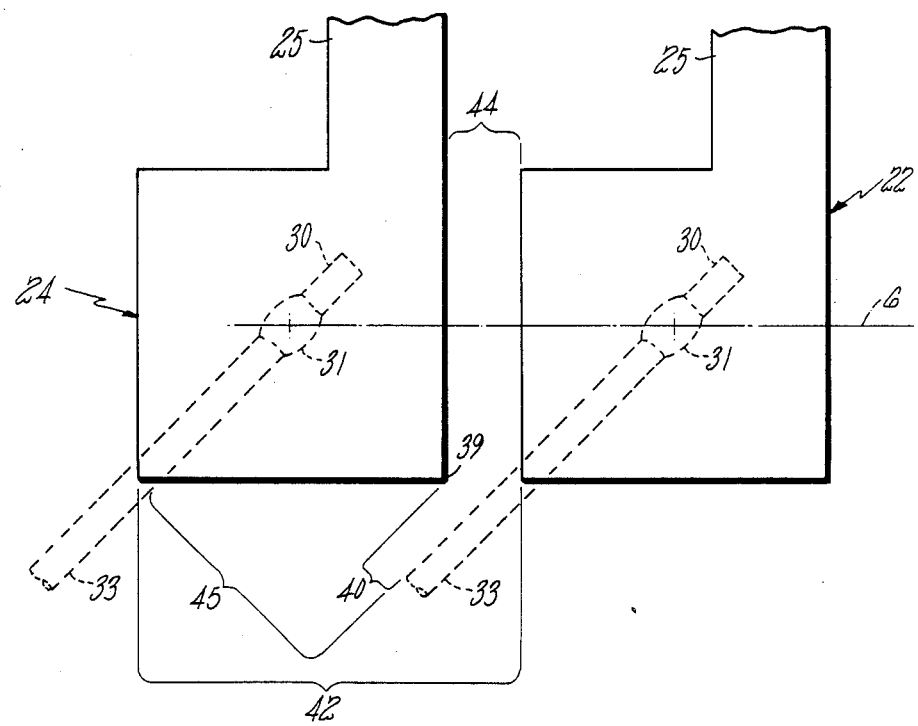
FIG. 2 illustrates a pair of bond pads from the prior art.

Referring now to FIG. 2, there are shown two bond pads constructed according to the prior art. Pad 22 on the right and pad 24 on the left of the Figure are displaced along an axis 6 by a pitch indicated by the bracket labeled with the numeral 42. They are separated by a pad gap distance indicated by a bracket labeled 44. In the case of sales for military purposes, military-specification standards for particulate contamination govern the closest approach between pads, or smallest amount that distance 44 may be. As the dimensions of integrated circuits shrink, there is constant pressure to reduce this distance.

Two wires, each indicated with the numeral 33, are compression bonded in the conventional center position of the prior art. The area over which the wire makes contact is indicated by the dotted ellipse labeled 31 in each case. A "foot" 30 is the remainder of the wire, or bond wire tail, from bond area 31 to the wire end. Since this is a plan view, the areas shown as wires 33 are the projection of the wires on the plane of the substrate. This projection will be referred to as the wire path. The distance between a wire and another wire or a pad will be referred to as being in three dimensions or as being in the plane of the substrate, as appropriate. Since the wire path is the projection on the substrate of the wire, two adjacent wires will be separated by the wire path distance only if they are in the same horizontal plane above the substrate. Otherwise, they will be separated by a greater amount that will depend on their separation in the vertical dimension. Accordingly, a minimum distance of closest approach between two wires may be specified by specifying that distance between the wire paths, since the three dimensional separation will always be greater than or equal to the wire path separation. When automated wire bonding machines are used, the trajectories of the wires are nearly identical and adjacent wires will be at the same height. In that case, the three-dimensional distance of closest approach will be nearly the same as the distance between wire paths.

Each bond pad 22 and 24 has a tab or lead (referred to as a fillet), indicated by the numeral 25 extending inward from the edge toward the interior of the circuit. Fillet 25 may be located at any point on the inboard side of the bond pad, of course. Conventionally, the wide portion of the pad is located on the periphery of the chip.

Two tolerances may be noted. The first, referred to as the distance of closest approach of the wire to another bond pad, is indicated by the bracket labeled 40 and is the shortest distance between a wire 33 and the closest point of the nearest pad. In "class S" work, which is meant to be used in space applications, this distance is one mil. In class B, or general military work, this distance is 0.1 mil. In this figure, the nearest pad is pad 24 and the closest point is corner 39. The other tolerance is the distance of closest approach between two wires. This is indicated by the bracket labeled with the numeral 45 in FIG. 2, and is also one mil for class S. For general military use, the condition is that the distance of closest approach is 0.1 mil. These conditions apply in three dimensions, of course, so that one wire could extend above another or above a pad.

Since the wires follow a three-dimensional path, the risk that a wire will approach a pad will depend on the vertical angle of the wire. Conventional wire bonders place the wire in a path that rises steeply on one end and is shallow at the other. The risk of contact or wires coming too close will be slightly less if the shallow end of the wire is at the package pads, because they conventionally have a larger pitch. The risk of a foot from a wire coming too close to the adjacent pad will not depend on the wire path, of course. For the purposes of this disclosure, the term distance of closest approach from a wire includes the wire foot as well as the main part of the wire.

The two wires 33 are shown in FIG. 2 as leading away from the corresponding pads at an angle of about 45 degrees with respect to axis 6. This sort of angle is found in bonding operations, because the spacing between pads in the package to which the other end of the wire is bonded is ordinarily greater than the spacing between pads on the chip, simply because there is more space that permits a greater tolerance. Thus, the wires will ordinarily exit along the axis of fillet 25 only near the center of the chip and, at other points, will have some angle with respect to that axis and therefore will have a greater risk of approaching the adjacent pad than if they did go out along the axis. For a conventional layout, the wires from the pads near the corners of a chip will have the greatest angle relative to the perpendicular, or the minimum angle with respect to the axis along which the pads are laid out. The extreme pads (those on the end) will have the minimum angles and will be referred to as the minimum angle pads. The risk of contacting an adjacent pad will apply to foot 30, as well as to wire 33, since both will be slanted toward the next pad.

Figure 3:
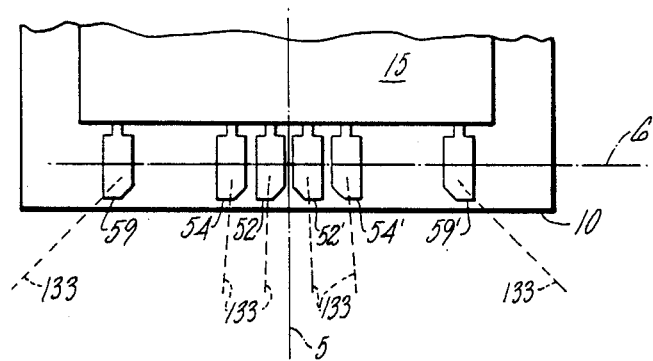
FIG. 3 illustrates in schematic form an integrated circuit showing the location of bond pads within the overall circuit.

An overall view of an integrated circuit is illustrated in FIG. 3, showing a semiconductor substrate 10 on which there is an interior portion where the actual circuit is located, indicated with the numeral 15. Coming out from this circuit are a number of pads of which only a few are shown. On the bottom side of the chip, there is an axis 5 at the midpoint. It may be useful to visualize a coordinate system, with axis 5 as the y axis, axis 6, along the pads, as the x axis, and the origin at the intersection of axes 5 and 6. In a conventional layout, there will be pads on all four sides of substrate 10, the others being omitted for simplicity in the figure. On either side of the center line there are pads indicated by the numerals 52, 54, 52', 54', 59 and 59'. Wires, indicated by a single dotted line and labeled by the same numeral 133, exit from each bond pad off to a bonding area on the package bond shelf that is not shown in this Figure. Pads 52 and 52' are the maximum angle pads and pads 59 and 59' are the corresponding minimum angle pads.

Figure 1:
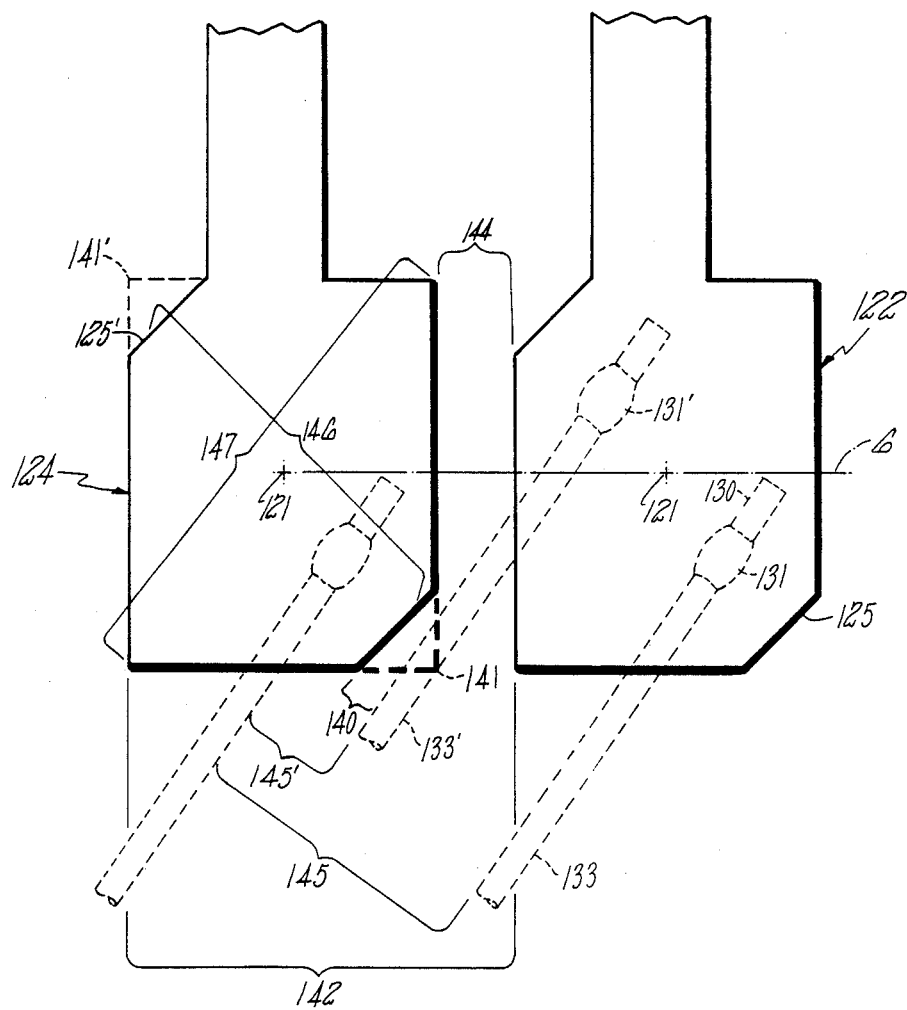
FIG. 1 illustrates a pair of bond pads constructed according to the invention.

Referring now to FIG. 1, there is shown a pair of pads constructed according to the invention. Pads 122 on the right and 124 on the left are separated by a pad gap distance 144 and are located with a pitch indicated by a bracket labeled 142. They have a shape that will be referred to as generally rectangular, i.e. the shape of the pads is closer to a rectangle than anything else, since it is a rectangle with two corners cut off. According to a preferred embodiment of the invention, pitch 142 is 6.37 mils. The pad width is 4.8 mils and therefore, by subtraction, pad gap 144 has a nominal value of 1.57 mils. In the preferred embodiment, the pad is longer than the 4 mil square pads used in the prior art, illustratively 6 mils.

There is shown, in dotted outline, locations of an elliptical bond area of the actual wire-to-pad contact indicated by the numeral 131, with a projecting foot 130 and the wires leading away indicated by the numeral 133. The unprimed numbers refer to a preferred first bonding location for the first bond on a pad and the primed numbers refer to an alternative location for a second bond if the first bond is defective. As can be seen in the drawing, in this example the preferred location is on the lower right portion of the pad, next to a 45 degree chamfer that will be explained below. The pad edge in the chamfered area is referred to by the numeral 125 and in words as the chamfer edge. The corner cut off by the chamfer is shown in dotted lines and indicated by the numeral 141. The two positions could be reversed, with the first location being in the upper left corner and the second location at the lower right. These bonding areas will be referred to as non-central areas, in contrast to the prior art, in which the nominal bond position was the center of the pad, the nominal positions according to the invention are displaced from the center. The pads shown are from the left side of an array like that shown in FIG. 2. Corresponding pads on the right side would have the preferred first location in the lower left corner. Points 121 are shown as being in the center of the pads. By the term "center" is meant the center of the rectangular area within which the bonding areas lie. The pads could be extended, in which case, the bonding areas may be placed with respect to a "center" that is not the center of the wide metal pad.

It is evident by inspection that the bonding area according to the invention is located closer to the edges of the bond pad than is the case in the prior art. Therefore, there is less tolerance for error in the bonding machine and there is an increased probability that a bond will be defective because it goes closer to an edge by an amount greater than the relevant tolerance. Those skilled in the art would not be likely to make such a location choice because of the evident danger of having a defective bond. As was explained above, conventional practice is to place the center of the bonding area in the center of the pad, thus giving the maximum tolerance between the actual bonding area and the pad edge.

The advantage of chamfer edge 125 can be seen in FIG. 1, in which the wire path of second-bond wire 133' clears edge 125 by the correct amount, but would have passed over corner 141 if the chamfer had not been made. (The chamfer may be any convenient angle. Forty-five degrees is preferred.) The existence of the chamfer itself will cause very few first bonds to fail, because corner 141 is farther from the first bonding site than the left and right edges of pad 124, so that chamfer 125 is about the same distance from the bond site as the other edges. The choice of a first bond site that is non-centered will, however, cause a number of bonds to fail that would have passed if the actual bond site had been the same distance off from a centered nominal location.

A diagonal distance of pad 124 is shown as distance 147, with shortened distances from edge 125 to a corresponding edge 125' being indicated as distance 146. In the symmetric case, the distance 146 should be greater than the sum of the widths of areas 131 and 131' by a reasonable margin. In a preferred embodiment, an aluminum wire of diameter 1.25 mils is bonded to an aluminum pad having a width of 4.8 mils and a distance 146 of 5.2 mils. The nominal width of bond areas 131 and 131' is 2 mils.

At present, rework is not permitted in class S work. Even in that case, pads constructed according to the invention are superior to the prior art because the chamfer in the lower right corner provides increased tolerance from a wire (whether bonded at a centered or a non-centered location) to the adjacent pad. Also, the chamfer in the upper left corner provides increased approach or gap tolerance to the projecting foot 130 from a wire.

As can be seen in FIG. 1, the critical situation for tolerances is that in which the minimum angle pad (usually on the end) has a wire in the outer bonding position and the closest pad (the next one in from the end) has been reworked, so that the distance of closest approach to the minimum angle pad is that of bracket 140 and the distance of closest approach to the next wire is that of bracket 145'. As was mentioned above, the tolerance for class S work is 1 mil in each case. Of course, the standards can be different for commercial work. Whatever the standards may be, the invention permits greater tolerance in a rework situation than does the prior art approach.

An additional benefit of the invention is that, when the first bond area is the outer one, it does not matter if the pad is damaged when the first wire is pulled off, because tearing or lifting the pad in the outer region will not affect the quality of the electrical path from the inner region to the circuit.

A further benefit of the invention is that it is easier to probe the pads constructed according to the invention. Conventionally, probe fixtures align the needles along an axis that extends through the center of the pads. The needles are generally horizontal and slide along the pad after they make contact. The extra pad length provides a greater tolerance for vertical variation in probe position, which will result in corresponding variations in the final probe position along the pad.

With the present invention, the probes may be staggered, i.e. alternate probe needles may be displaced toward and away from the chip edge, thus giving greater clearance between adjacent needles for a given pad pitch. The distance between probes will be the hypotenuse of a right triangle having one leg equal to the pitch (distance 142) and the other leg equal to a predetermined spacing along the pad. The hypotenuse will always be greater than the pitch, of course, and the offset distance will be the result of a trade-off between yield in the probing operation and use of silicon area for pads. This distance would be greater, of course, than the inter-probe distance between consecutive probes along the pad axis (axis 6), in order to realize the benefit of improved spacing.

If the pads are sufficiently long, then wires from the inner (and even the outer) location may extend over the adjacent pad. This is perfectly acceptable, so long as the wires rise steeply enough to clear the pad and the wire paths are separated by a great enough tolerance that the three-dimensional distance of the closest approach is acceptable.

We claim:

1. An integrated circuit module comprising:
   a package for enclosing an integrated circuit and containing a plurality of package bond pads;
   a semiconductor substrate defining a substrate plane and having a central area and a peripheral area located between said central area and an edge of said substrate;
   a plurality of electronic components formed into an integrated circuit within said central area;
   a plurality of generally rectangular circuit bond pads, each having a center point, connected to said integrated circuit and being disposed at predetermined locations within said peripheral area, said predetermined locations being located along a pad axis extending parallel to said edge of said substrate, and each of said circuit bond pads having a bond pad width along said pad axis and being separated by a pad gap distance less than said bond pad width along said axis from a closest bond pad; and
   a plurality of wires, each bonded to a predetermined circuit bond pad at a single pad bond area on said circuit bond pad and to a corresponding package bond pad, whereby each of said plurality of wires extends above a predetermined wire path in said substrate plane and has a predetermined wire to pad distance of closest approach in three dimensions to an adjacent second bond pad, characterized in that:
   each circuit bond pad has a set of two pad bond areas comprising a first pad bond area and an alternative pad bond area, both of said first pad bond area and said alternative pad bond areas being located at predetermined non-central locations within said bond pad, an outer non-central location being located toward said edge of said substrate and an inner non-central location being located toward said central area and each of said plurality of wires is bonded to said predetermined circuit bond pad at one of said first pad bond area and alternative pad bond area;
   each of said predetermined wire paths makes a predetermined wire path angle with said pad axis, thereby defining maximum and minimum wire path angles associated with predetermined maximum angle and minimum angle pads of said plurality of circuit bond pads; and
   the wire path extending from said inner non-central location of a closest circuit bond pad adjacent to said minimum angle pad has a wire path to pad distance of closest approach that is greater than a predetermined wire path to pad tolerance.

2. An integrated circuit module according to claim 1, further characterized in that said plurality of generally rectangular circuit bond pads each have a first chamfer, having a first chamfer distance greater than said wire path diameter on the outer corner closest to a wire path, whereby the distance of closest approach from said wire path to an adjacent bond pad is increased.

3. An integrated circuit module according to claim 2, further characterized in that said plurality of generally rectangular bond pads are disposed in two groups on opposite sides of a transverse axis perpendicular to said pad axis, and that said first chamfers are formed on the outer corner of a bond pad that is closer to said transverse axis.

4. An integrated circuit module according to claim 3, further characterized in that said first pad bond area is located between said center point and said first chamfer.

5. An integrated circuit module according to claim 3, further characterized in that said plurality of generally rectangular circuit bond pads each have a second chamfer on an opposite corner from said first chamfer.

6. An integrated circuit module according to claim 2, further characterized in that said first pad bond area is located between said center point and said first chamfer.

7. An integrated circuit module according to claim 6, further characterized in that said plurality of generally rectangular bond pads each have a second chamfer on an opposite corner from said first chamfer.

8. An integrated circuit module according to claim 2, further characterized in that said plurality of generally rectangular circuit bond pads each have a second chamfer, having a second chamfer distance greater than said wire path diameter on an opposite corner from said first chamfer.

9. An integrated circuit module comprising:
a package for enclosing an integrated circuit and containing a plurality of package bond pads;
a semiconductor substrate defining a substrate plane and having a central area and a peripheral area located between said central area and an edge of said substrate;
a plurality of electronic components formed into an integrated circuit within said central area;
a plurality of generally rectangular circuit bond pads, connected to said integrated circuit and being disposed at predetermined locations within said peripheral area, said predetermined locations being located along a pad axis extending parallel to said edge of said substrate, and each of said circuit bond pads having a bond pad width along said pad axis being separated by a pad gap distance less than said bond pad width along said axis from a closest bond pad; and
a plurality of wires, each bonded to a predetermined circuit bond pad at a pad bond area on said circuit bond pad and to a corresponding package bond pad, whereby each of said plurality of wires extends above a predetermined wire to path in said substrate plane and has a predetermined wire to pad distance of closest approach in three dimensions to an adjacent second bond pad, characterized in that:
each circuit bond pad has a set of two pad bond areas comprising a first pad bond area and a alternative pad bond area, both of said first pad bond and said alternative pad bond areas being located at predetermined non-central locations within said bond pad, an outer non-central location being located toward said edge of said substrate and an inner non-central location being located toward said central area and each of said plurality of wires is bonded to said predetermined circuit bond pad at one of said first pad bond area and alternative pad bond areas;
each of said predetermined wire paths makes a predetermined wire path angle with said pad axis, thereby defining maximum and minimum wire path angles associated with predetermined maximum angle and minimum angle pads of said plurality of circuit bond pads; and
that wire path extending from said outer non-central location on said minimum angle pad and the wire path extending from said inner non-central location of said closest bond pad adjacent to said minimum angle pad have a wire path distance of closest approach in said substrate plane that is greater than a predetermined wire path tolerance.

10. An integrated circuit module comprising:
a package for enclosing an integrated circuit and containing a plurality of package bond pads;
a semiconductor substrate having a central area and a peripheral area located between said central area and an edge of said substrate;
a plurality of electronic components formed into an integrated circuit within said central area;
a plurality of generally rectangular circuit bond pads, connected to said integrated circuit and being disposed with a predetermined pitch at predetermined locations within said peripheral area, said predetermined locations being located along a pad axis extending parallel to said edge of said substrate from an origin, each of said circuit bond pads having a center point and a bond pad width along said pad axis and being separated by a pad gap distance less than said bond pad width along said axis from a closest bond pad; and
a plurality of wires, each bonded to a predetermined circuit bond pad at a pad bond area on said circuit bond pad and to a corresponding package bond pad, whereby each of said plurality of wires extends along a predetermined wire path in the plane of said substrate and has a predetermined wire to pad distance of closest approach in said plane of said substrate to an adjacent circuit second bond pad, characterized in that:
each circuit bond pad has a predetermined width along said axis and a predetermined length perpendicular to said axis, said length being greater than said width;
each bond pad has a chamfer, having a chamfer edge and a chamfer distance greater than said wire path diameter, on that corner located toward said edge and toward said origin;
each of said predetermined wire paths makes a predetermined wire path angle with said pad axis, thereby defining a maximum and a minimum wire path angle associated with predetermined maximum angle and minimum angle pads of said plurality of circuit bond pads; and
that wire to pad distance of closest approach extending to said minimum angle pad from the wire path associated with said closest circuit bond pad adjacent to said minimum angle pad extends to said chamfer edge by a wire to pad distance of closest approach that is greater than a predetermined tolerance.

11. An integrated circuit according to claim 10, further characterized in that each of said plurality of circuit bond pads has a second chamfer, having a second chamfer distance greater than said wire path diameter on a corner diagonally opposite said first chamfer.

12. An integrated circuit comprising:
a semiconductor substrate having a central area and a peripheral area located between said central area and a substrate edge of said substrate;
a plurality of electronic components formed into an integrated circuit within said central area;

a plurality of generally rectangular circuit bond pads, connected to said integrated circuit and being disposed with a predetermined pitch at predetermined locations within said peripheral area, said predetermined locations being located along a pad axis extending parallel to said substrate edge of said substrate from an origin, each of said circuit bond pads having a reference point, having a bond pad width along said pad axis and being separated by a pad gap distance less than said bond pad width along said axis from a closest bond pad; characterized in that:

each circuit bond pad has a predetermined width along said axis and a predetermined length perpendicular to said axis, said length being greater than said width by an amount such that a first wire bond area may be placed within said circuit bond pad between said reference point and said chamfer and a second wire bond area may be placed symmetrically with respect to said reference point, said length and said width being further related by the condition that said first and second wire bond areas be no closer to any edge of said pad than a predetermined edge tolerance.

13. An integrated circuit according to claim 12, further characterized in that each circuit bond pad has a first chamfer, having a first chamfer edge, on that corner located toward said substrate edge and toward said origin.

14. An integrated circuit according to claim 13, further characterized in that each of said circuit bond pads has a second chamfer, on a corner opposite said first chamfer.

* * * * *